(12) United States Patent
Paredis et al.

(10) Patent No.: US 11,125,805 B2
(45) Date of Patent: Sep. 21, 2021

(54) DEVICE FOR MEASURING SURFACE CHARACTERISTICS OF A MATERIAL

(71) Applicant: IMEC VZW, Leuven (BE)

(72) Inventors: Kristof Paredis, Oud-Heverlee (BE); Umberto Celano, Leuven (BE); Wilfried Vandervorst, Mechelen (BE)

(73) Assignee: IMEC vzw, Leuven (BE)

(*) Notice: Subject to any disclaimer, the term of this patent is extended or adjusted under 35 U.S.C. 154(b) by 181 days.

(21) Appl. No.: 16/518,730

(22) Filed: Jul. 22, 2019

(65) Prior Publication Data
US 2020/0033395 A1 Jan. 30, 2020

(30) Foreign Application Priority Data

Jul. 26, 2018 (EP) ..................... 18185713

(51) Int. Cl.
G01R 31/20 (2006.01)
G01R 31/26 (2020.01)
G01N 27/00 (2006.01)

(52) U.S. Cl.
CPC ..... *G01R 31/2648* (2013.01); *G01R 31/2621* (2013.01); *G01N 27/002* (2013.01)

(58) Field of Classification Search
CPC ............ G01R 31/2621; G01R 31/2648; G01R 31/2831; G01R 1/07321; G01N 27/002
(Continued)

(56) References Cited

U.S. PATENT DOCUMENTS 5,136,252 A * 8/1992 Witt ................. G01N 27/20
324/715
6,477,132 B1 11/2002 Azuma et al.
(Continued)

FOREIGN PATENT DOCUMENTS

CN 206735794 U 12/2016
EP 1788400 A2 5/2007
(Continued)

OTHER PUBLICATIONS

Lee et al., "V-shaped metal—oxide—semiconductor transistor probe with nano tip for surface electric properties", Ultramicroscopy 108 (2008) 1094-1100.
(Continued)

*Primary Examiner* — Thang X Le
(74) *Attorney, Agent, or Firm* — Knobbe, Martens, Olson & Bear, LLP

(57) ABSTRACT

A device is provided for electrically measuring surface characteristics of a sample. The device comprises at least one group of three electrodes: a first and second electrode spaced apart from each other and configured to be placed onto the surface of the sample, and a third electrode between the first two but isolated from these two electrodes by a one or more first insulators, wherein a second insulator further isolates the central electrode from the sample when the device is placed thereon. The three electrodes and the insulators are attached to a single or to multiple holders with conductors incorporated therein for allowing the coupling of the electrodes to power sources or measurement tools. The placement of the device onto a semiconductor sample creates a transistor with the sample surface acting as the channel. The device thereby allows the determination of the transistor characteristics of the sample in a straightforward way.

15 Claims, 13 Drawing Sheets

(58) Field of Classification Search
USPC .......................................................... 324/715
See application file for complete search history.

(56) References Cited

U.S. PATENT DOCUMENTS

| | | | |
|---|---|---|---|
| 6,529,024 B2* | 3/2003 | Noda | G01R 1/06738 |
| | | | 324/72.5 |
| 6,913,982 B2 | 7/2005 | Lim et al. | |
| 7,008,811 B2 | 3/2006 | Park et al. | |
| 7,335,942 B2 | 2/2008 | Edinger et al. | |
| 7,402,736 B2 | 7/2008 | Moon et al. | |
| 7,411,210 B2 | 8/2008 | Jung et al. | |
| 7,464,584 B2 | 12/2008 | Park et al. | |
| 10,067,162 B2* | 9/2018 | Shi | G01R 3/00 |
| 2006/0231754 A1* | 10/2006 | Wang | G01Q 70/12 |
| | | | 250/309 |
| 2010/0153033 A1* | 6/2010 | Schaus | G01R 31/311 |
| | | | 702/57 |
| 2014/0320108 A1* | 10/2014 | Dewa | B82Y 10/00 |
| | | | 324/72.5 |
| 2018/0348258 A1* | 12/2018 | Buschnakowski | G01R 1/073 |

FOREIGN PATENT DOCUMENTS

| | | |
|---|---|---|
| JP | 2007010404 A | 1/2007 |
| WO | WO 98/45719 A1 | 10/1998 |

OTHER PUBLICATIONS

Ko et al., "High-Resolution Field Effect Sensing of Ferroelectric Charges", Nano Lett. 2011, 11, 1428-1433.
Extended European Search Report dated Jan. 31, 2019 for European Patent Application No. 18185713.7 in 10 pages.

* cited by examiner

A-A

DEVICE FOR MEASURING SURFACE CHARACTERISTICS OF A MATERIAL

INCORPORATION BY REFERENCE TO RELATED APPLICATION

Any and all priority claims identified in the Application Data Sheet, or any correction thereto, are hereby incorporated by reference under 37 CFR 1.57. This application claims priority to European Application No. EP 18185713.7, filed on Jul. 26, 2018. The aforementioned application is incorporated by reference herein in its entirety, and is hereby expressly made a part of this specification.

FIELD

The embodiments are related to the electrical measurement of surface characteristics of materials, the primary application being the measurement of the transistor characteristics of semiconductor materials.

BACKGROUND

The transistor characteristics of a semiconductor material, having one or more regions of electronic charge carriers, include among others the resistivity, the carrier mobility, the threshold voltage, and the subthreshold swing of these regions. Some characteristics, such as resistivity and Hall mobility, can be determined by conventional methods, such as a (micro) 4-point probe for determining the sheet resistance/resistivity and the Micro Hall Effect technique for determining the carrier Hall mobility. However, the 4-point probe and Hall effect measurements do not provide full data on the material under investigation and they are unable to probe the influence of a gate voltage applied to the material.

Alternatively, source/drain and gate areas and corresponding contacts may be produced on a sample of the material to enable the study of the material's full behaviour when acting as a transistor. While the production of source/drain/gate on a sample does provide more complete information on the electronic characteristics, it requires an extensive processing effort and does not allow to probe the transistor characteristics of pristine, unprocessed materials, given that the processing as such will have an influence on the material that is being studied.

A more straightforward technique that allows studying the transistor channel behaviour and obtaining the above named data (resistivity etc.), applicable on unprocessed materials, is not available in the present state of the art.

SUMMARY OF THE INVENTION

The embodiments aim to provide a technique that allows the direct measurement of the transistor characteristics of a semiconductor material without the need of building an actual transistor on the material. This aim is achieved by a measurement device in accordance with the appended claims. The embodiments are related to a device for measuring surface characteristics of a sample by an electric measurement. The sample may be a semiconductor sample, but the device may also be used to measure surface characteristics of other materials. The device comprises at least one group of three electrodes: a first and second electrode spaced apart from each other and configured to be placed onto the surface of the sample, and a third electrode between the first two but isolated from these two electrodes by one or more first insulators, wherein a second insulator isolates the central electrode from the sample when the device is placed thereon. The assembly of the three electrodes and the insulators is attached to a single or to multiple holders with conductors incorporated therein for allowing the coupling of the electrodes to power sources or measurement tools. The placement of the device onto a semiconductor sample creates a transistor with the sample surface acting as the channel. The device thereby allows to determine the transistor characteristics of the sample in a straightforward way, without requiring processing steps for producing source, drain and gate electrodes on the sample.

The embodiments are in particular related to a device for electrically measuring surface characteristics of a sample, the device comprising:

A first and second electrode, distanced apart from each other and configured to be in physical contact with the surface of the sample when the device is placed thereon, A third electrode, at least a portion of which is located in the area between the first and second electrode, One or more first insulators configured to electrically isolate the third electrode from said first and second electrodes, A second insulator configured to electrically isolate the third electrode from the sample surface when the device is placed on said sample surface, and;

One or more holders attached to the assembly of the first, second and third electrodes and the first and second insulators, wherein conductors are incorporated in the one or more holders for electrically connecting the three electrodes individually to a respective power source or measurement tool.

According to an embodiment, the first and second electrode, and the third electrode or said portion thereof are arranged colinearly. In the latter case, the device may further comprise two additional electrodes placed on either side of the colinear assembly of the first, second and third electrode, the additional electrodes being electrically isolated from the first and second electrode and from the third electrode, wherein the holder or holders comprise additional conductors for connecting the additional electrodes individually to a respective power source or measurement tool.

The first and second electrode and the two additional electrodes may be pillar-shaped electrodes arranged in a linear array, wherein the third electrode fills a continuous area in between the electrodes and around the array, while being isolated form the array of electrodes by the one or more first insulators, and wherein the second insulator electrically isolates the third electrode from the sample surface when the device is placed thereon.

The device may comprise one or more further electrodes, placed colinearly with and in addition to said two additional electrodes and electrically isolated therefrom.

According to an embodiment, the three electrodes are arranged coaxially, wherein the first electrode forms a central electrode, the third electrode forms a sleeve around the first electrode, and the second electrode forms a sleeve around the first and third electrodes, with the first insulator forming a double sleeve that electrically isolates the third electrode from the first and second electrodes and the second insulator electrically isolating the third electrode from the sample surface when the device is placed thereon.

The coaxial embodiment of the device may further comprise two additional coaxial electrodes placed on either side of the coaxial assembly of the first, second and third electrode, in the radial direction of said coaxial assembly, and isolated from said first and second electrode and from the third electrode, wherein the holder or holders comprise additional conductors for connecting the additional electrodes individually to a respective power source or measurement tool.

The coaxial device may further comprising one or more further coaxially placed electrodes, in addition to said two additional electrodes and electrically isolated therefrom.

The device may comprise a single holder, wherein the assembly of the three electrodes and the first and second insulators is attached to said single holder. In the latter case, the first and second electrode may extend further outward from the holder then the second dielectric portion, so that said first and second electrode need to be pushed into the sample surface in order to realize a physical contact between the second dielectric portion and the sample surface.

According to an embodiment, the device comprises three separate holders, wherein the first electrode, the second electrode and the assembly of the third electrode and the first and second insulators are respectively attached to said three holders.

The one or more holders in a device according to an embodiment may be cantilever-type holders. The device may comprise multiple groups of electrodes, each group comprising at least a first, second and third electrode and first and second insulators in accordance with any of the preceding paragraphs, and wherein said groups are attached to a single holder or to multiple holders.

The embodiments are furthermore related to the use of a device in accordance with the embodiments for determining transistor characteristics of a sample having a semiconducting surface area, wherein the holder or holders of the device is/are manipulated so as to place the first electrode, the second electrode and the second insulator simultaneously on the conductive surface area of the sample, thereby creating a transistor comprising source, drain and gate electrodes, a gate dielectric and a channel, wherein the first and second electrodes respectively act as the source and drain electrodes, the third electrode acts as the gate electrode, the second insulator acts as the gate dielectric, and the sample surface area between the first and second electrodes acts as the channel.

The embodiments are furthermore related to a method for measuring surface characteristics of a sample comprising the steps of:
Placing a device according to any one of the preceding claims on the surface of a sample so that the first and second electrode and the second insulator are in physical contact with the sample surface,
Applying an electric voltage to the first, second and third electrodes,
Measuring by an electrical measurement, one or more surface characteristics of the sample.

DETAILED DESCRIPTION

Figure 1A:
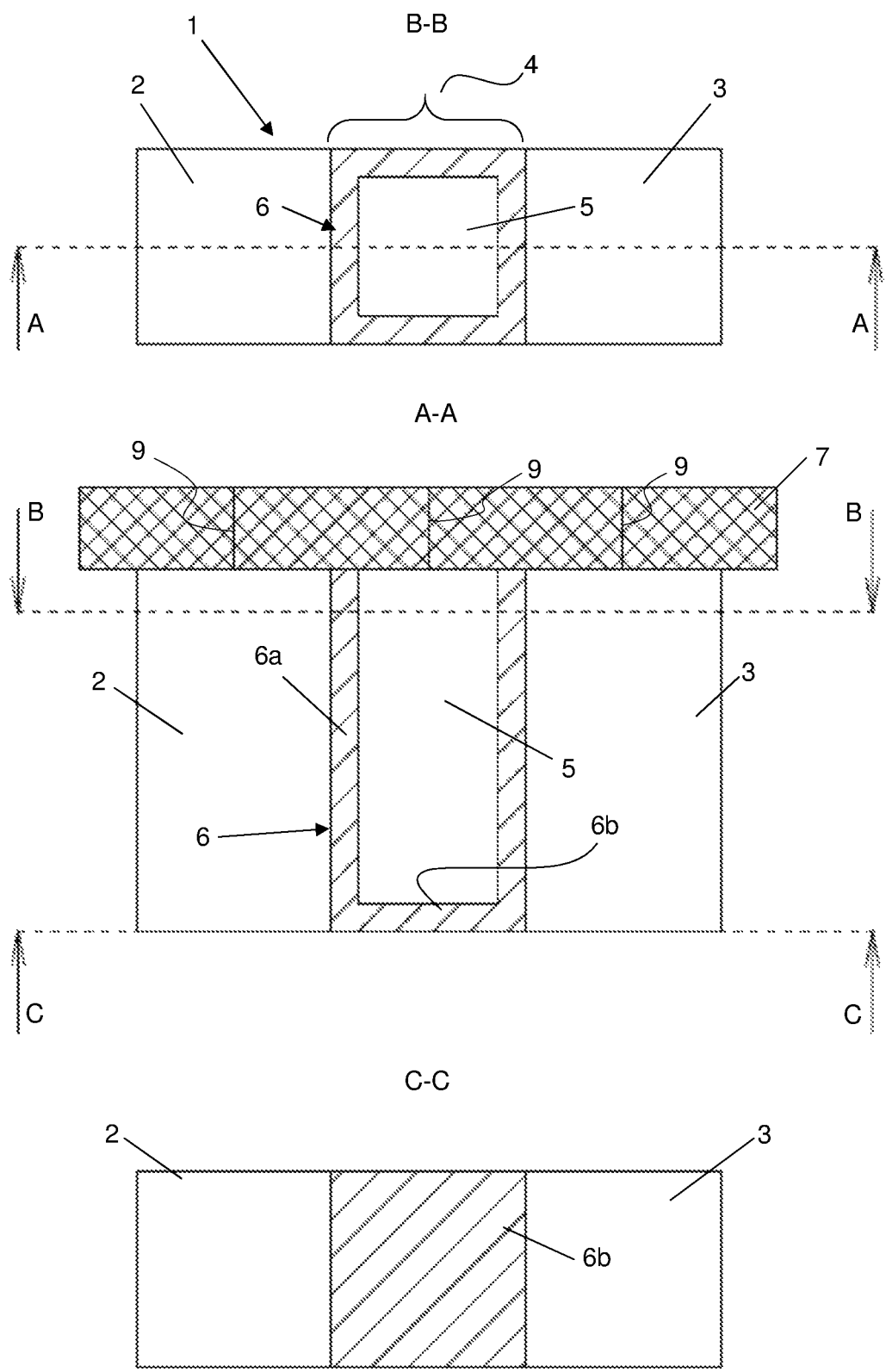
FIG. 1A is a conceptual image of the structure of a device according to an embodiment. The figure shows a top view, a frontal section view and a bottom view of the device.

A measurement device according to an embodiment comprises a structure that replicates the gate structure and the source and drain electrodes of a transistor. A conceptual image of one embodiment of the device is shown in FIG. 1A. The device 1 comprises three adjacent portions 2,3 and 4 arranged in contact with each other so that the assembly of the three portions may be placed onto the surface of a sample under test, in such a manner that the three portions are simultaneously in physical contact with the sample. The three portions are: a first 2 and a second electrode 3 spaced apart from each other, and a third portion 4 filling the space between electrodes 2 and 3, the third portion 4 comprising a third electrode 5 and a dielectric layer 6. The third electrode 5 is electrically isolated from the first 2 and second 3 electrodes by the two vertical side portions 6a of the dielectric layer 6. The three portions 2, 3 and 4 are attached to a holder 7. The third electrode 5 is electrically isolated from a test sample 8 by the horizontal portion 6b of the dielectric layer 6, when the device is placed onto a surface of the sample, as illustrated in FIG. 2. Conductors 9 are incorporated in the holder 7 for connecting the electrodes 2, 3 and 5 individually to a respective external voltage source or measurement tool.

Figure 1B:
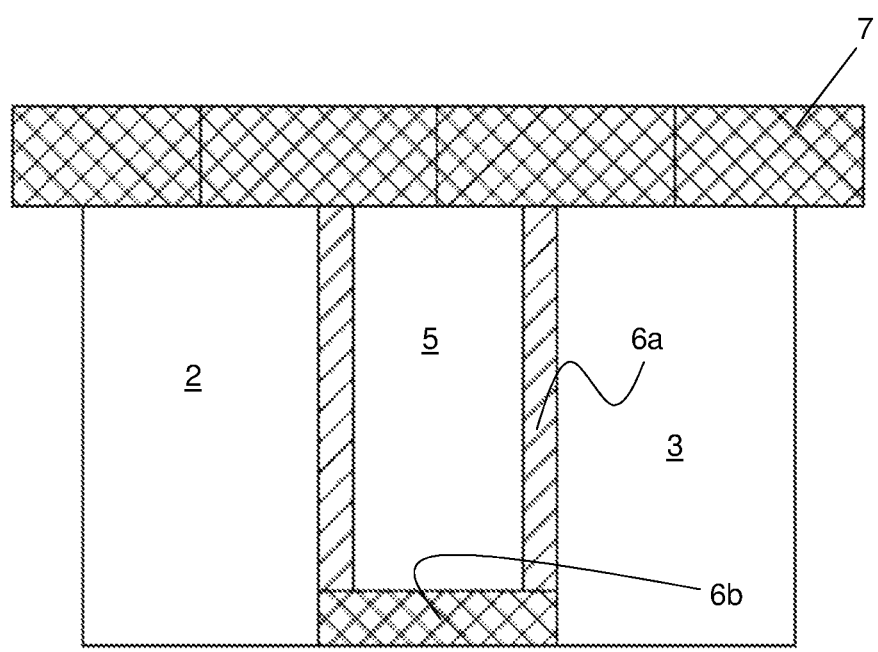
FIG. 1B shows a device according to an embodiment with an alternative structure of the insulators included in the device.

The dielectric layer portions 6a and 6b performing the functions of isolating the central electrode 5 from the lateral electrodes 2,3 and of isolating the central electrode 5 from the sample 8 are not necessarily subportions of a single continuous layer 6. The composition and structure of portions 6a and 6b can be brought into practice in any way that is realistically feasible for performing the above functions. For example, either of the portions 6a and 6b could be formed of a stack of several dielectric layers of different materials, or portion 6b could be different from portion 6a in terms of its thickness and composition. Other electrically insulating materials than a dielectric can be used. The general term for portions 6a and 6b applied in the appended claims is therefore a 'first insulator' and 'second insulator'. FIG. 1B illustrates an embodiment wherein the first insulator 6a and the second insulator 6b have different compositions (symbolized by the hatching) and different thickness.

Figure 2A:
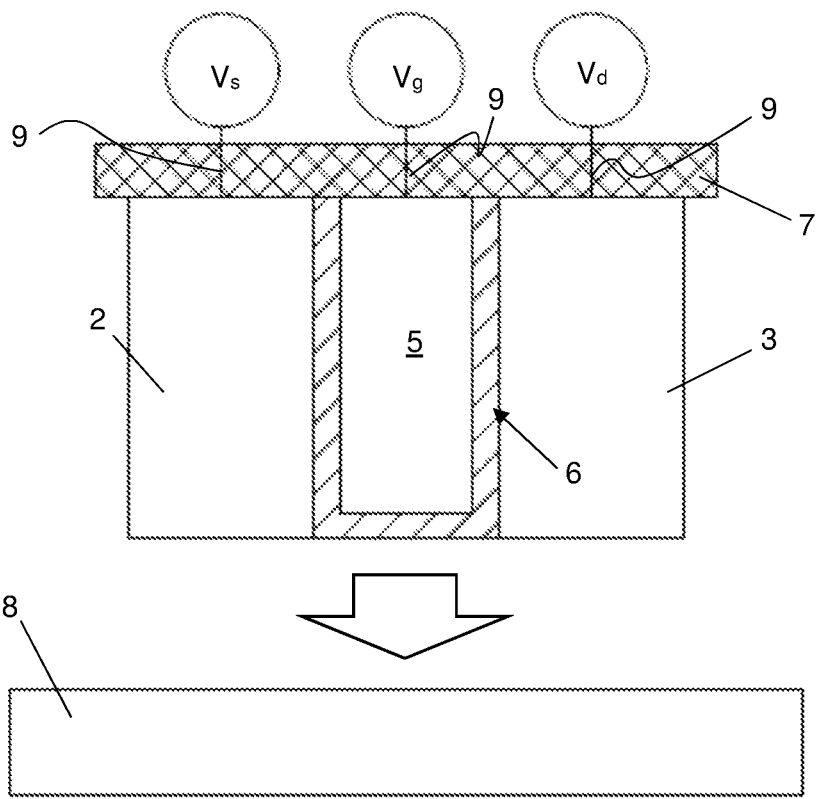
FIGS. 2A and 2B illustrate the operation of the device when placed onto a sample surface.
Figure 2B:
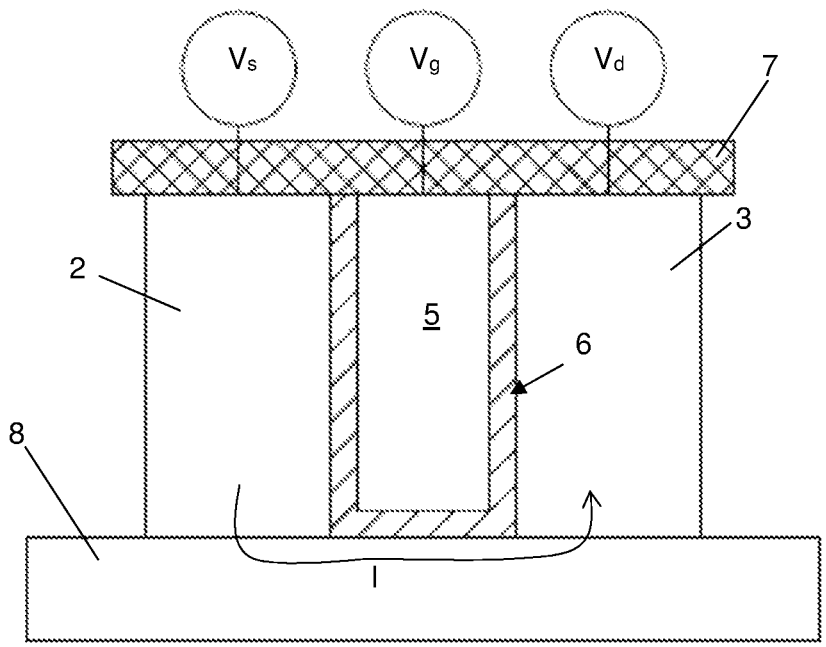

While the embodiments are not limited thereto, the use of the device is described hereafter for measuring transistor characteristics of the surface of a uniform area of a semiconductor sample 8. As seen in FIGS. 2a and 2b, when the device is placed onto the surface of the sample 8 in such a manner that an electrically conductive junction is formed between the first 2 and second 3 electrodes 3 and the sample 8, a transistor structure is formed, with the conductive area between electrodes 2 and 3 playing the part of the transistor channel. The first 2 and second 3 electrodes form source and drain electrodes respectively, coupled to source and drain voltages $V_s$ and $V_d$. The central electrode 5 acts as a gate electrode coupled to gate voltage $V_g$, and the portion 6a of the dielectric layer 6 between said central electrode 5 and the sample surface forms the gate dielectric of the transistor structure. By applying a bias between the first 2 and second 3 electrodes, a current I is driven through the material under test, thereby allowing a direct measurement of I-V characteristics. When the voltage $V_g$ applied to the central electrode 5 is changed, the current is modulated and the transistor characteristics of the sample material can be determined. For instance, the current I can be measured as a function of the gate voltage while the drain voltage is maintained constant, or the current can be measured as a function of the drain voltage for a given gate voltage. The carrier mobility can for instance be determined by plotting $I_{ds}$ vs $V_g$ in either the linear or quadratic regime, and calculating the mobility from the slope of the obtained curves. Other parameters that can be measured or calculated using the device are the subthreshold swing, the threshold voltage and the $I_{on}/I_{off}$ ratio.

The device may be brought into practice in a variety of ways. The assembly of the three portions 2, 3 and 4 may form a single block attached to a single holder 7, for example a cantilever type holder known from SPM (Scanning Probe Microscopy) technology. In this case, the device may be produced underneath the cantilever, replacing the typical (sharp) tip of an SPM cantilever. The conductors 9 may be incorporated in the cantilever holder in a manner known from SPM technology. Alternatively, the holder 7 and the conductors 9 may be similar to the holder of a multipoint probe, such as the 4-point probe referred to above. As the holder is similar to these known holder types, the device can be manipulated in a manner and by manipulation tools which are also similar to the techniques referred to above. These tools are known to the person skilled in the art and are therefore not described here in detail.

Figure 3A:
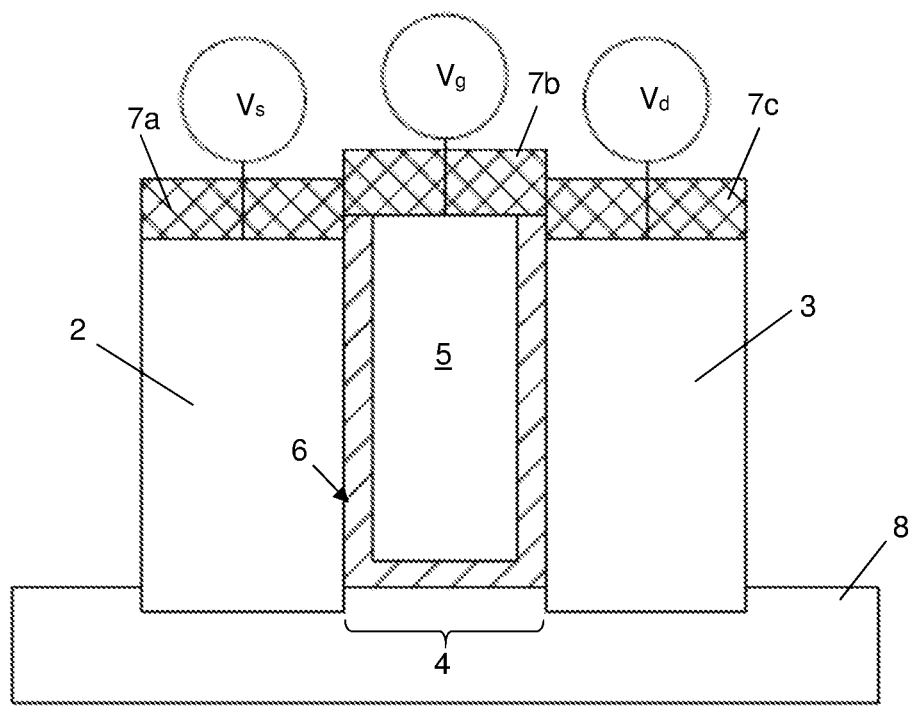
FIGS. 3A and 3B show other possible embodiments wherein three portions of the device are attached to separate holders.
Figure 3B:
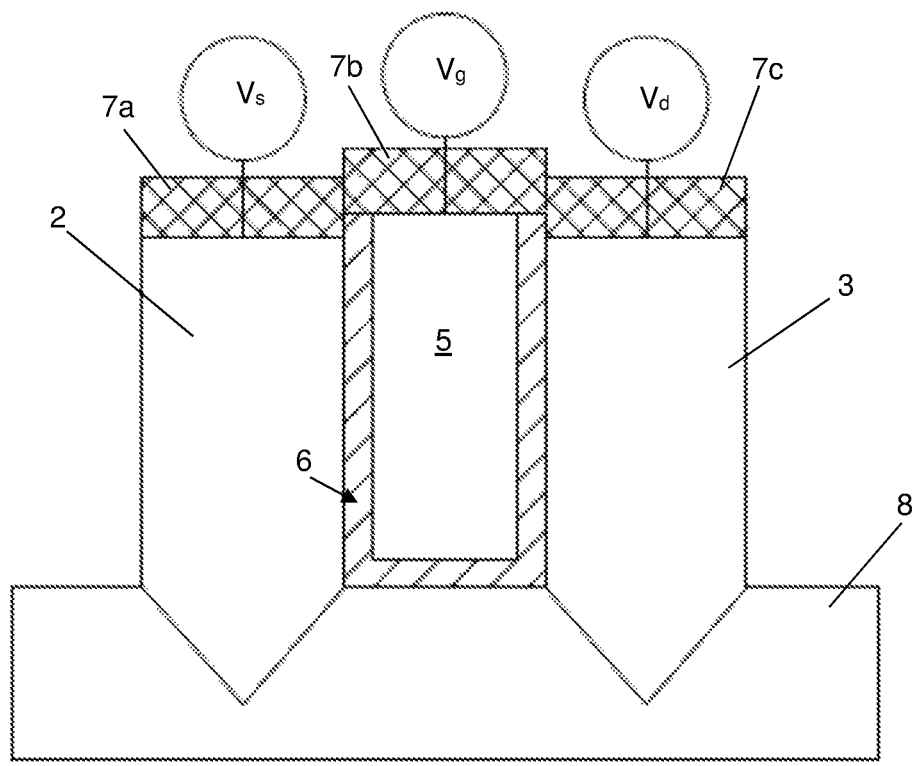

Instead of having a single holder 7, the three electrodes may be held by three respective holders, thereby allowing a movement of the electrodes relative to each other, for instance in the direction perpendicular to the sample surface. An embodiment of this type is shown in FIG. 3A. The outer electrodes 2 and 3 are attached to holders 7a and 7c, while the central portion 4 consisting of the assembly of the central electrode 5 and the dielectric layer 6 is attached to holder 7b. By exerting a higher force on the outer holders 7a and 7c, the outer electrodes 2,3 are pushed downward onto the sample 8 with a higher pressure than the central portion 4, so that the outer electrodes 2 and 3 are partially impressed into the material of the sample 8. In this way, the electrical contact between the outer electrodes 2,3 and the sample 8 may be improved. Alternatively, the outer electrodes 2,3, when attached to separate holders, may be provided with pointed outer ends, as illustrated in FIG. 3B, further allowing an improved electrical contact with the surface of the sample 8. The holders 7a, 7b and 7c need to be designed so that they can be controlled separately by a manipulation tool, at least in the direction perpendicular to the surface of the sample. Movements in a plane parallel to the surface could be controlled for all three holders simultaneously. For example three cantilevers could be placed close together and coupled to a manipulation tool configured to manipulate the three cantilevers separately, at least in the direction perpendicular to the sample surface, while the tool moves all three holders simultaneously in a plane parallel to the sample surface. According to an embodiment, the separate holders, such as the holders 7a, 7b and 7c in FIG. 3A or 3B, are in fact sub-portions of a single holder, which are movable relative to each other and relative to the main body of the holder, in the direction perpendicular to the substrate.

Figure 4A:
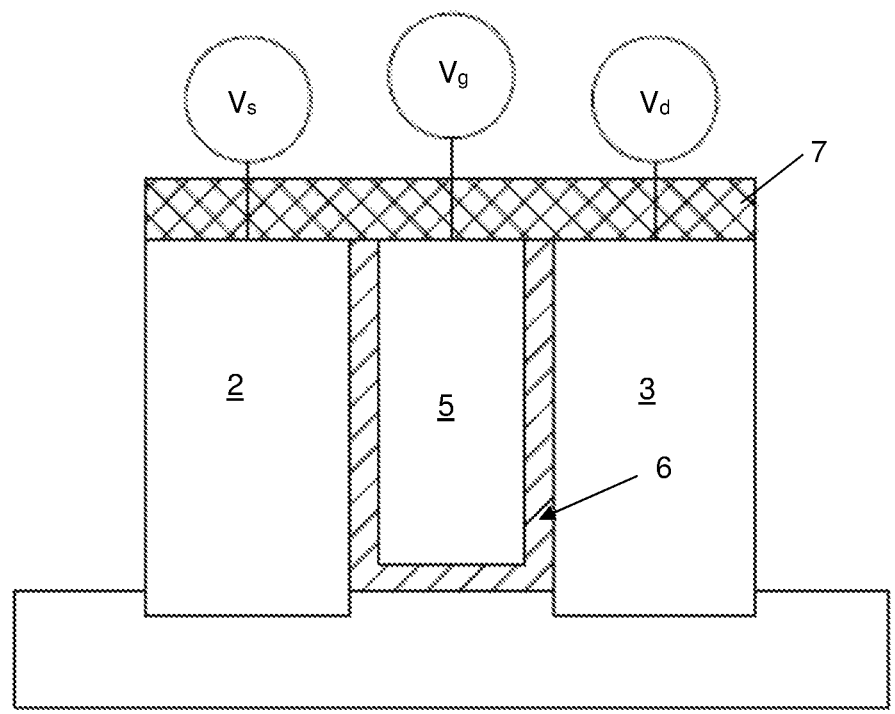
FIGS. 4A and 4B show embodiments wherein the side electrodes extend further outward from the holder than the central electrode.
Figure 4B:
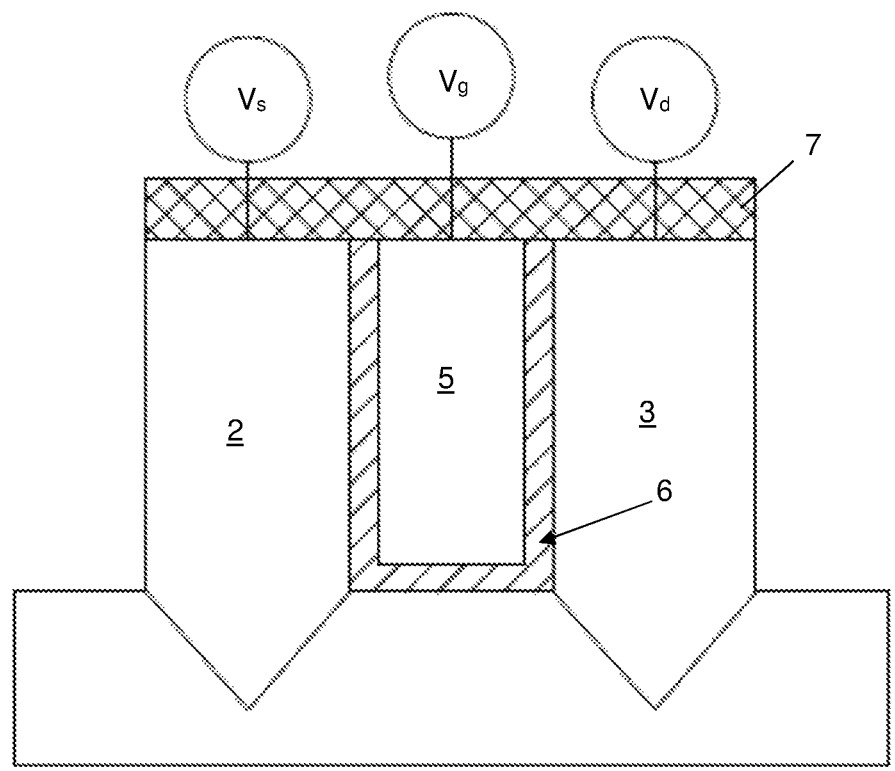

According to another embodiment illustrated in FIGS. 4A and 4B, the outer electrodes 2 and 3 extend further outward from the holder 7 and towards the sample surface than the central portion 4, with the outer surface of the electrodes 2 and 3 being either flat (FIG. 4A) or pointed (FIG. 4B), but the outer electrodes and the central portion 4 are attached to a single holder 7. In this way, when the device is placed onto the sample and a pressure is applied, the electrodes 2 and 3 need to be impressed into the surface, in the manner illustrated in FIGS. 4A and 4B, in order for a physical contact to be realized between the dielectric portion 6b and the sample surface.

When attached to a single holder 7, the three electrodes 2,3 and 5 are not movable relative to each other when the insulators 6a and 6b are formed of a solid material, i.e. the electrodes 2,3,5 and the insulators form a uniform body placed as a whole on the surface of the sample. According to another embodiment, at least the insulator 6a is formed of a liquid or flexible material, which does allow a slight movement of the outer electrodes 2 and 3 relative to the central electrode 5.

Figure 5:
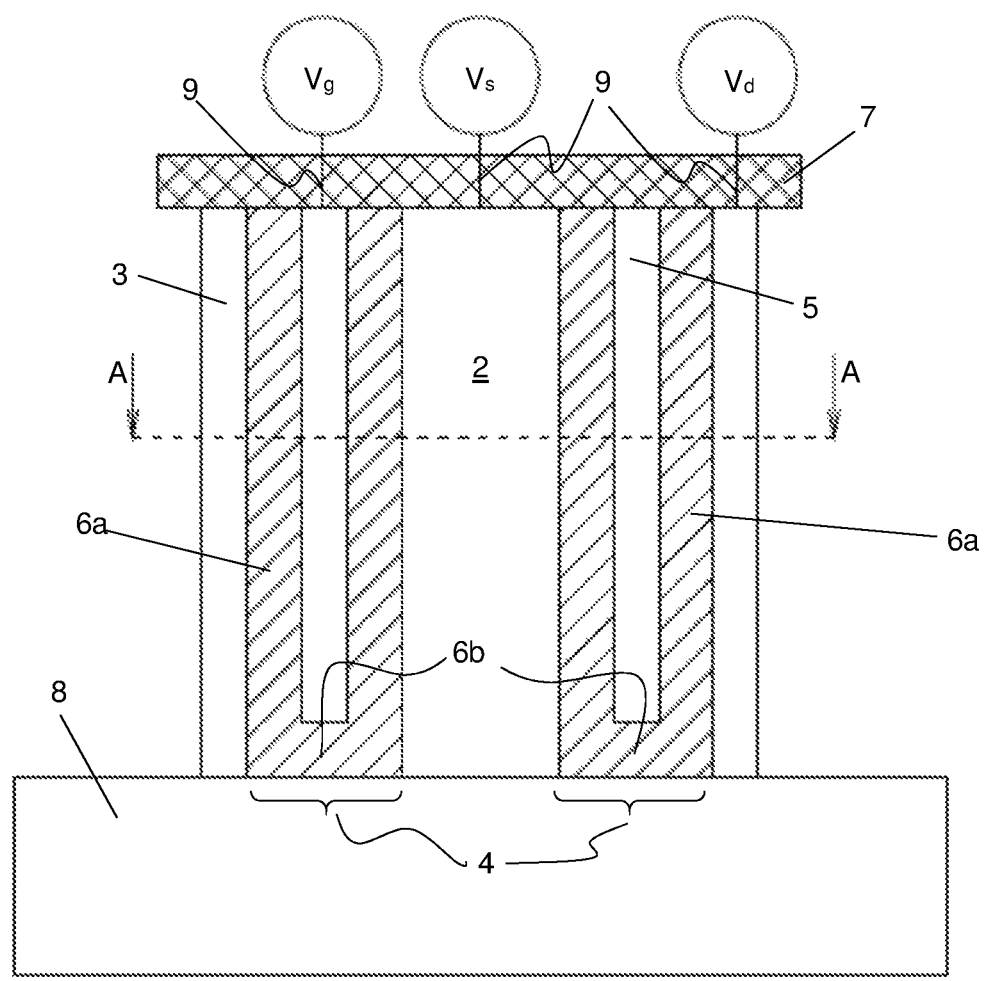
FIG. 5 shows a coaxial embodiment of a device according to an embodiment. The figure shows a top view and frontal section view of the device.
Figure 5:
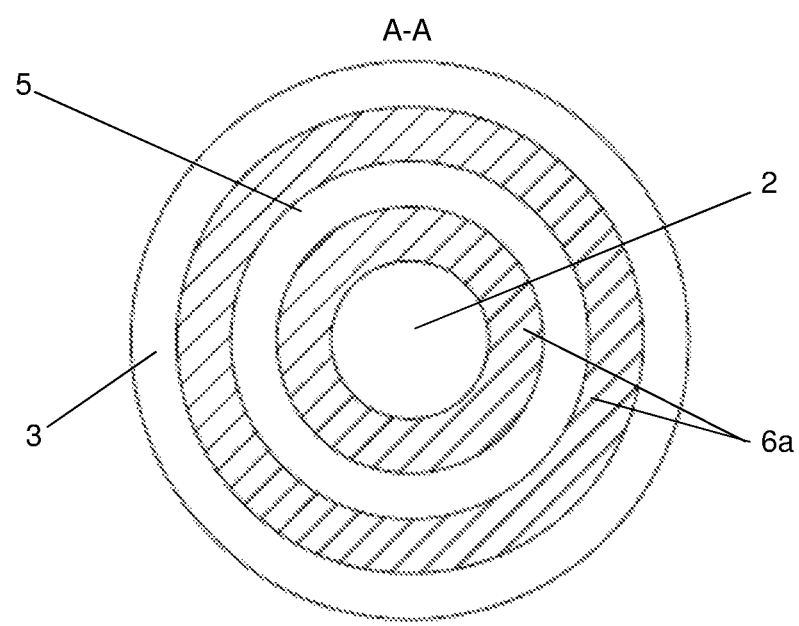

According to another embodiment, the three electrodes 2, 3 and 5 are not colinear, but coaxial. This embodiment is illustrated in FIG. 5. The source electrode is a cylindrical portion 2 placed in the centre of the device. The gate electrode 5 and drain electrode 3 are formed as electrically conducting sleeves around the central electrode 2. The dielectric 6 comprises a first portion 6a in the form of a double sleeve, isolating the central source electrode 2 from the gate electrode 5 and the gate electrode 5 from the drain electrode 3, while having a second portion 6b at the bottom of the device, to be placed in physical contact with the surface of the sample 8, while isolating the gate electrode 5 from the surface. This embodiment is advantageous in that it forces the source-drain current to pass fully underneath the gate dielectric, whereas in the colinear embodiments, leakage currents could occur.

Figure 6A:
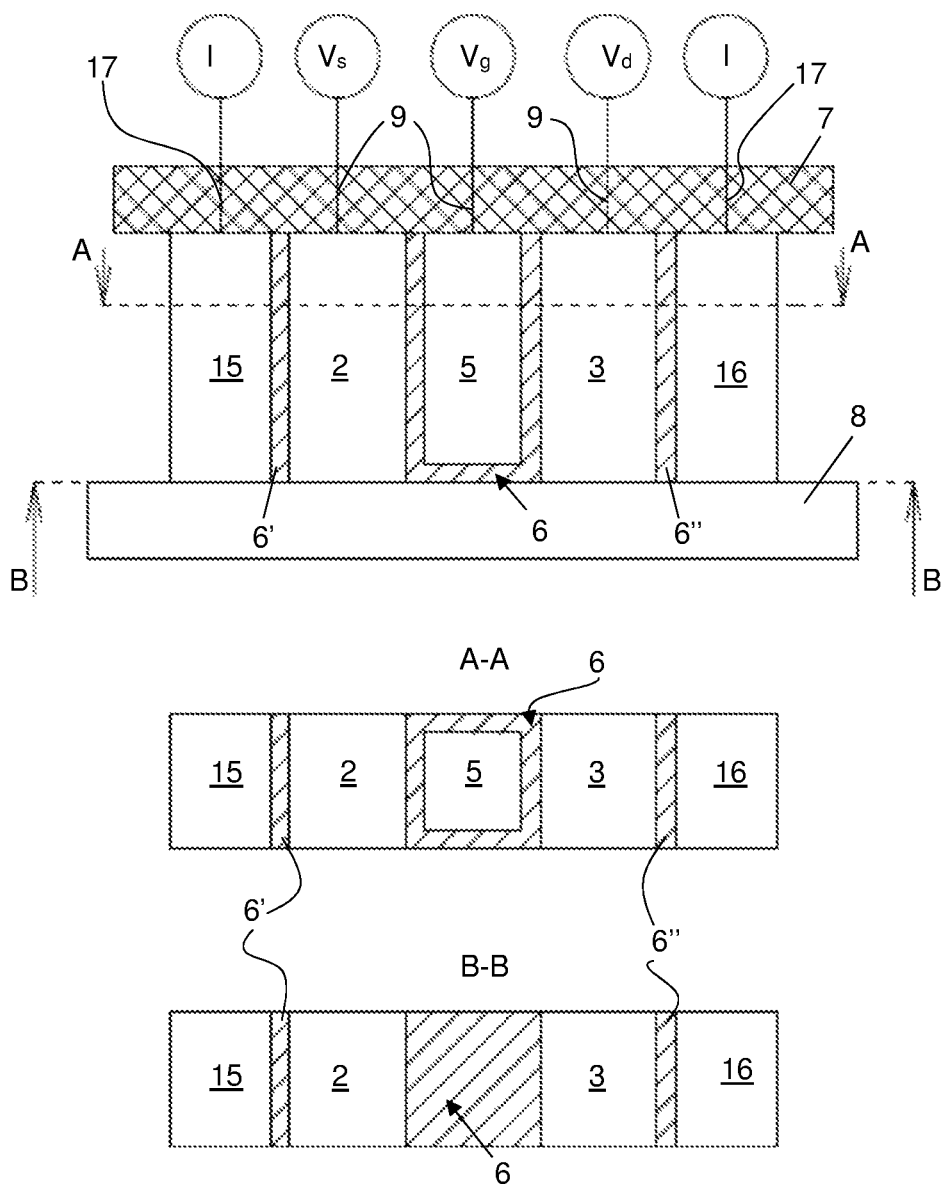
FIGS. 6A and 6B show colinear and coaxial embodiments which include additional electrodes coupled to a current source.

Additional electrodes may be incorporated in the device. FIG. 6A shows an embodiment wherein in addition to the colinear device described above, two additional electrodes 15 and 16 are included, placed on either side of the pair of electrodes 2 and 3, so that the five electrodes 15,2,5,3,16 are placed in a straight line. The additional electrodes 15 and 16 are electrically isolated from the first and second electrodes by further dielectric layers 6' and 6". The additional electrodes 15 and 16 are coupled to further conductors 17 incorporated in the holder 7. In use, the additional electrodes 15 and 16 may be coupled to a current source, as illustrated in FIG. 6A, while the other electrodes function again as source, drain and gate electrodes when the device is placed on the surface of a sample 8. The current source generates a current I that passes through the sample underneath electrodes 2, 5 and 3. In this manner, the transistor characteristics may be measured without being affected by the contact resistance between electrodes 2 and 3 and the sample 8.

A coaxial device according to an embodiment as shown in FIG. 5 may equally be provided with additional electrodes.

Figure 6B:
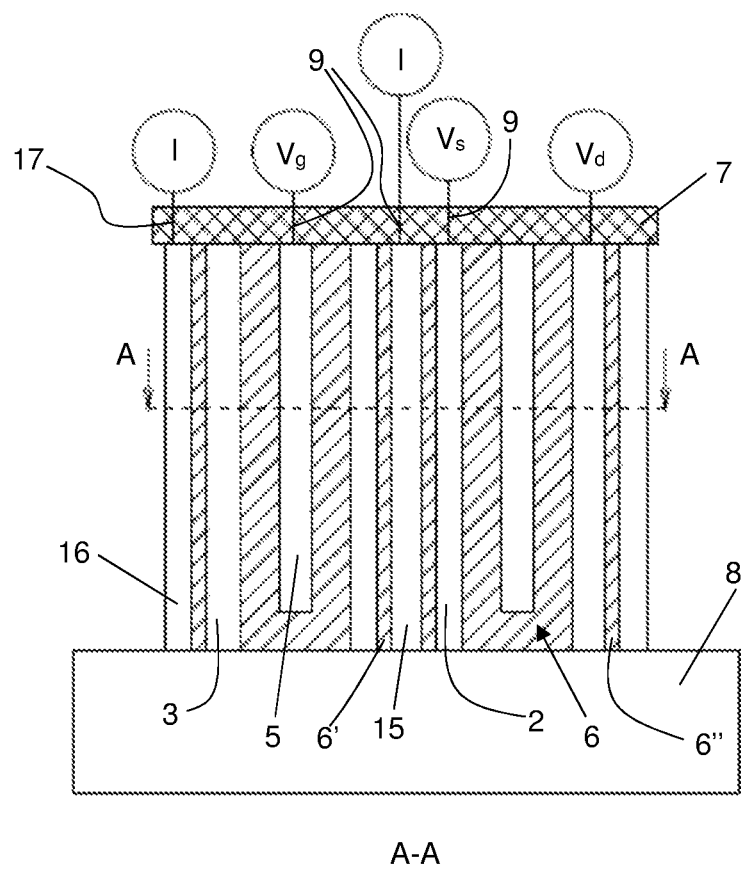
Figure 6B:
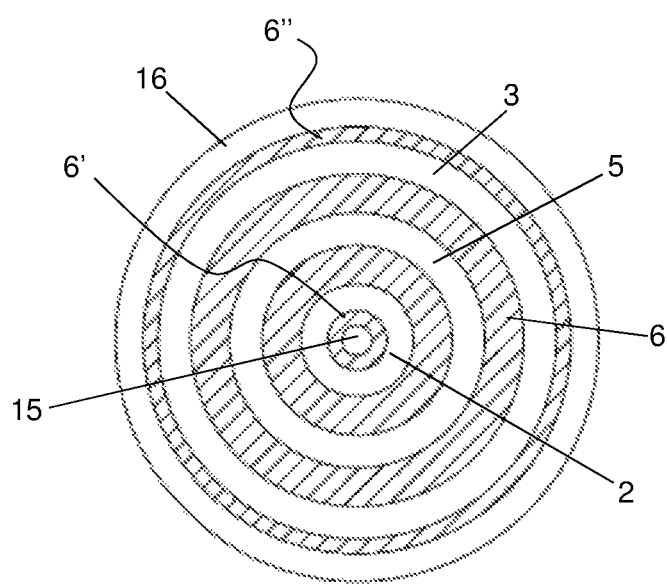

The coaxial equivalent of the device of FIG. 6A is shown in FIG. 6B. The central electrode 15 and the outer electrode 16 may be coupled to a current source generating a current I. Dielectric sleeves 6' and 6" isolate these additional electrodes from the basic assembly of the three electrodes 2, 3 and 5 and the dielectric 6. Further coaxial electrodes and dielectric sleeves could be added.

Figure 7:
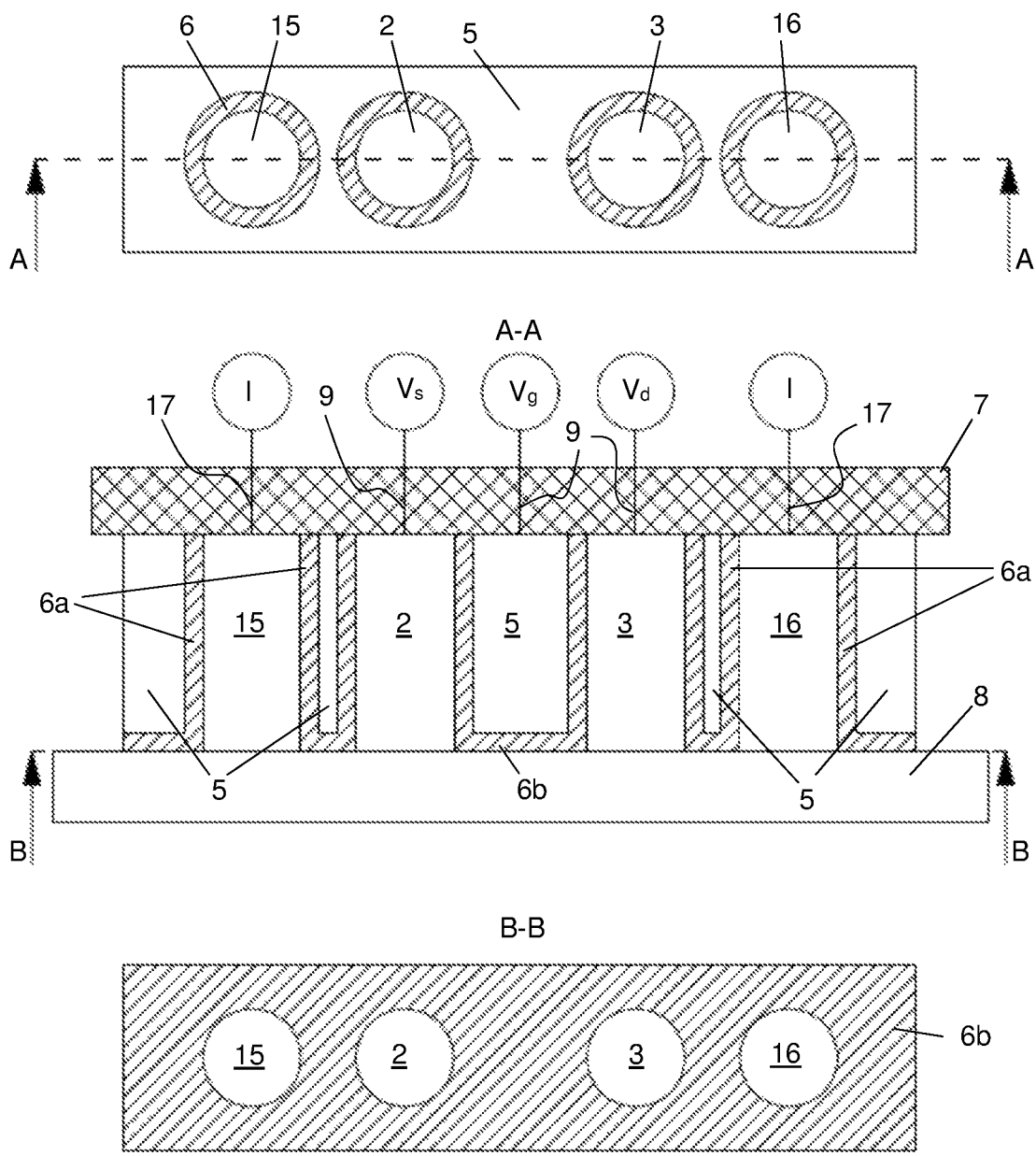
FIG. 7 shows a further embodiment of a colinear device according to an embodiment, comprising additional lateral electrodes.

In another embodiment illustrated in FIG. 7, the first and second electrodes 2 and 3 are cylindrically shaped pillars of conductive material. A pair of additional and similarly shaped electrodes 15 and 16 is furthermore included, placed on either side of the pair of electrodes 2 and 3, so that the four cylindrical electrodes 15,2,3,16 are placed in a straight line. The third electrode 5 surrounds the entire area between and around the array of four electrodes, while the first portion 6a of the dielectric layer 6 isolates the third electrode 5 from all four of the cylinder-shaped electrodes 2, 3, 15 and 16, while the second portion 6b isolates the third electrode 5 from the sample 8 when the device is placed thereon. The additional electrodes 15 and 16 are coupled to further conductors 17 incorporated in the holder. In use, the additional electrodes 15 and 16 may be coupled to a current source, as illustrated in FIG. 7, while the other electrodes function again as source, drain and gate electrodes as described above. The device of FIG. 7 without the additional electrodes 15 and 16 and with electrode 5 fully isolated form the sample 8, is another embodiment of the basic group of three electrodes 2,3 and 5 having the functionality described above.

The device according to an embodiment may comprise further additional electrodes, instead of or in addition to the electrodes 15 and 16 shown in FIGS. 6A, 6B, and 7. According to an embodiment, the device comprises multiple three-electrode assemblies like the one described above, i.e. multiple groups of a first electrode 2, a second electrode 3 and a third electrode 5 at least partially in between the two, with a dielectric layer 6a and 6b respectively isolating the third electrode from the first two and from the sample when the device is placed thereon. These groups could be arranged in a linear array or in 2-dimensional pattern on the contact surface of the device. Such a device allows to test multiple areas of a sample in a single measurement. The multiple groups may be attached to a single holder or they could be attached to separate holders configured to be manipulated simultaneously by a manipulation tool. The device may further comprise additional electrodes having the same functionality as the electrodes 15 and 16 shown in FIGS. 6A, 6B, and 7. The device may for example comprise a plurality of three-electrode assemblies in a linear array, with one or more additional electrodes in between each pair of two adjacent three-electrode assemblies. Such a structure allows to perform measurements with different pairs of the additional electrodes connected to a current source. Also, a single three-electrode assembly 2+3+5+6 could be integrated in the device with more than two additional electrodes like electrodes 15 or 16, so as to allow measurements with a single 'transistor' on the sample, but with a current running between different pairs of the additional electrodes.

Figure 8A:
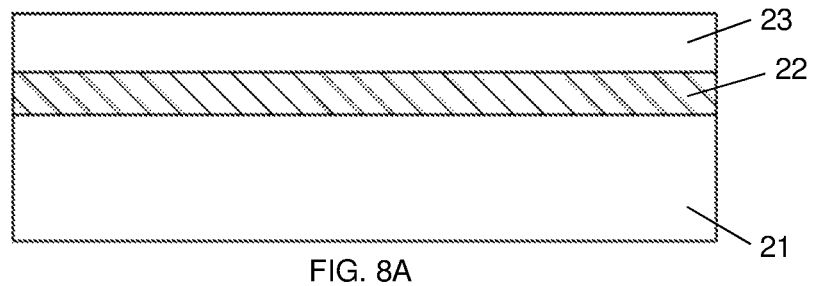
FIGS. 8A to 8H illustrate a possible manufacturing process for producing a device according to an embodiment.
Figure 8B:
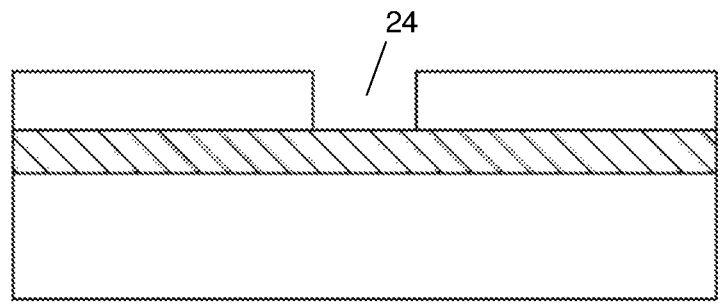
Figure 8C:
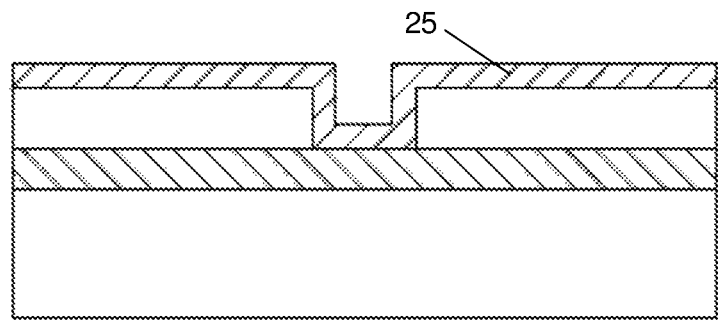
Figure 8D:
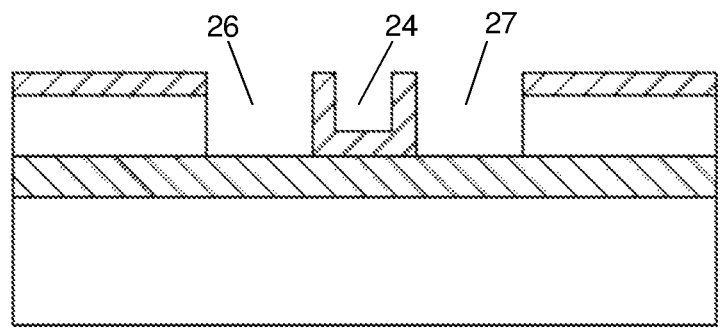
Figure 8E:
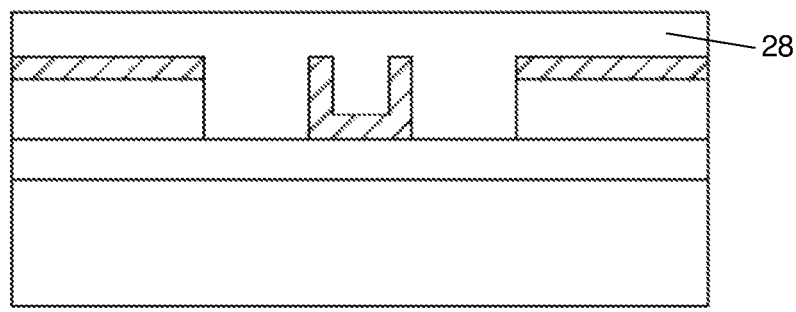
Figure 8F:
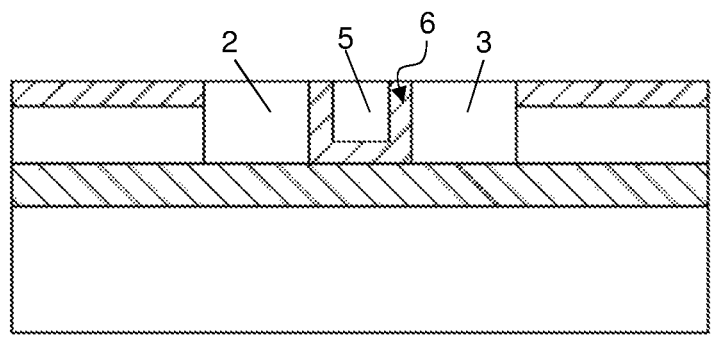
Figure 8G:
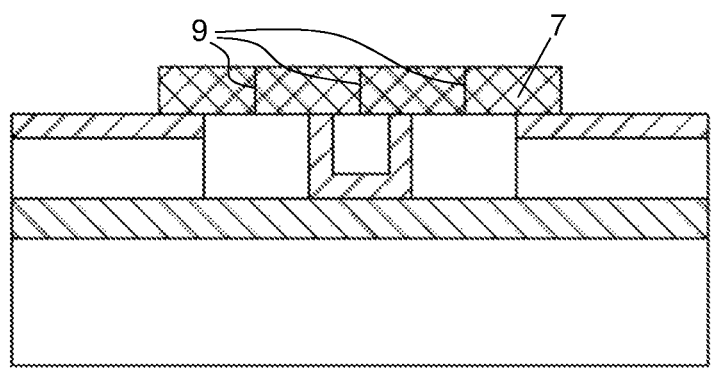
Figure 8H:
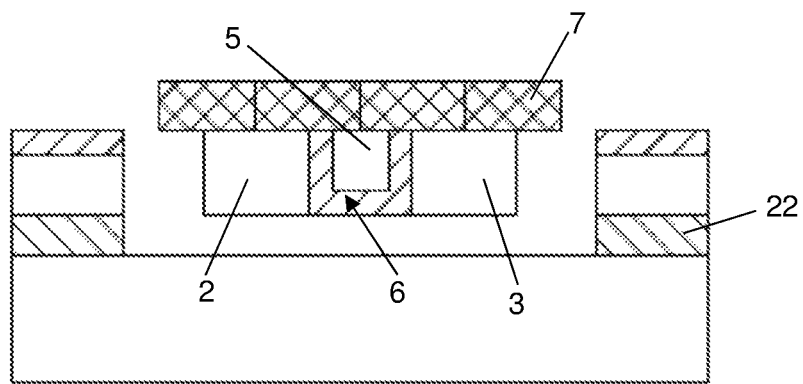
Figure 9:
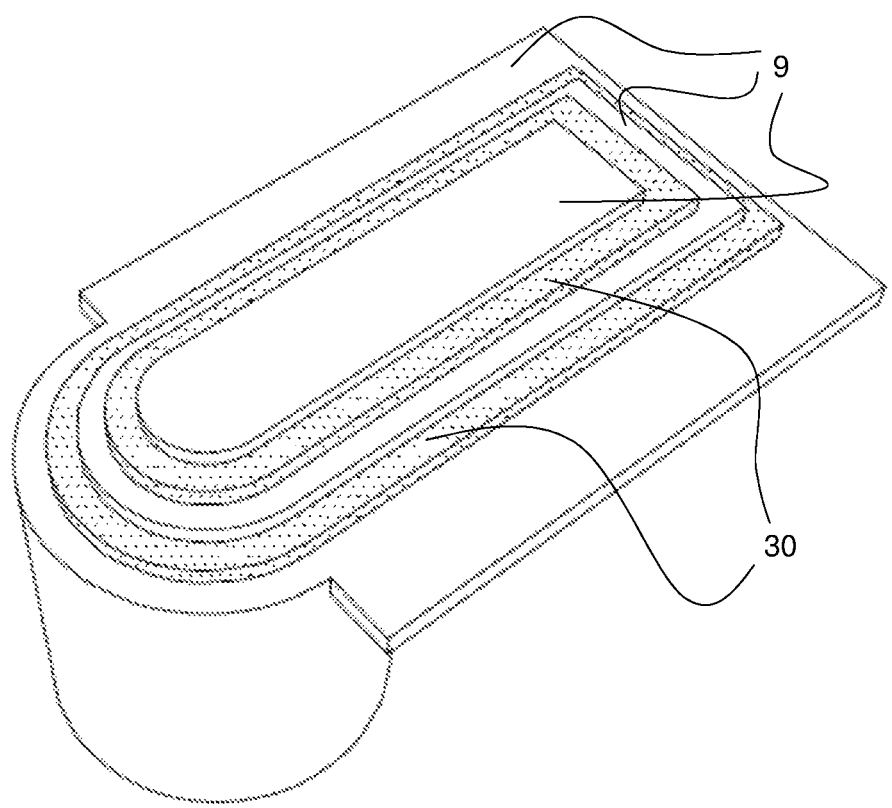
FIG. 9 illustrates a device according to an embodiment with a cantilever-type holder and a coaxial arrangement of the electrodes.

The dimensions of the electrodes in a device according to an embodiment may range from the order of magnitude of nanometres to a larger scale, up to millimetres or centimetres. The preferred production method of the device will change as a function of the dimensions. For example, nanometre and micrometre-scale devices can be produced by known CMOS-type processing methods performed on a silicon-on-insulator (SOI) wafer, as described hereafter with reference to FIGS. 8A to 8H. A process is shown for producing a device according to the embodiment of FIG. 1, when the dimensions of the device are in the nano- to micrometre range, for example the electrodes 2, 3 and 5 have an approximately square cross-section with the length of one side between 20 nanometres and 20 micrometres. The process is applicable also for producing the other embodiments described above. The process starts from an SOI substrate (FIG. 8A) known as such in the art, and consisting of a silicon base substrate 21, with a stack of two layers on top of the base substrate 21, the stack consisting of a dielectric layer 22, typically formed of silicon dioxide, and a silicon layer 23. By a first patterning step, performed by lithography and etching, an opening 24 is formed in the silicon layer 23 (FIG. 8B). The opening 24 and the remaining silicon layer is lined with a dielectric layer 25 (FIG. 8C), by a conformal deposition step. The dielectric 25 may be silicon dioxide or any other suitable non-conductive material. Another lithography and etch step is performed (FIG. 8D), for removing portions of the silicon layer 23 and of the dielectric layer 25 on either side of the opening 24, thereby forming open areas 26 and 27. Another deposition step (FIG. 8E) is performed, wherein a conductive material 28 is deposited, for example a metal, filling the opening 24 and the open areas 26 and 27. After a planarization step (FIG. 8F), the electrodes 2,3 and 5 of the device are formed, as well as the dielectric layer 6. The holder 7 is then produced (FIG. 8G), by depositing a layer or a stack of layers and patterning said layer or stack. The formation of the holder furthermore includes the production of the conductors 9. This may be done according to known processes for the production of holders for SPM probes or 4-point probes for example. The holder 7 may be formed of a non-conductive material with the connectors 9 incorporated therein and produced by damascene-type processes used in CMOS processing. However, as illustrated in FIG. 9 for the case of a cantilever holding the coaxial electrodes shown in FIG. 5, the main material of the holder could also be a metal, with dielectric portions 30 incorporated in the holder, separating metal portions of the holder, which metal portions then represent the conductors 9. Returning to the process flow of FIG. 8, the device is finally released from the SOI substrate by etching an opening circumventing the holder 7 and removing the oxide layer of the SOI by an underetching process (FIG. 8H).

While the device is described above in the context of determining transistor characteristics of a uniform area of a semiconductor sample, the use of the device is not limited thereto. The device may be applied to any electrically conductive or electrically insulating material, either on a uniform surface area of a constant composition, or on a patterned area. When applied to an insulating material, the device allows to determine the current-voltage characteristics of the material under the influence of a gate voltage to verify the degree to which the material is effectively an insulator. The device may be used on a patterned surface by placing the first and second electrode on patterned areas of the surface, for example doped areas destined to become source and drain areas of a transistor, thereby allowing to test transistor characteristics before actually processing the gate.

The dielectric layer portions 6a and 6b performing the functions of isolating the central electrode from the lateral electrodes and of forming the gate dielectric are not necessarily subportions of a single continuous dielectric layer 6. The composition and structure of portions 6a and 6b can be brought into practice in any way that is realistically feasible for performing the above functions. For example, either of the portions 6a and 6b could be formed of a stack of several dielectric layers of different materials, or portion 6b could be different from portion 6a in terms of its thickness and composition.

Figure 10:
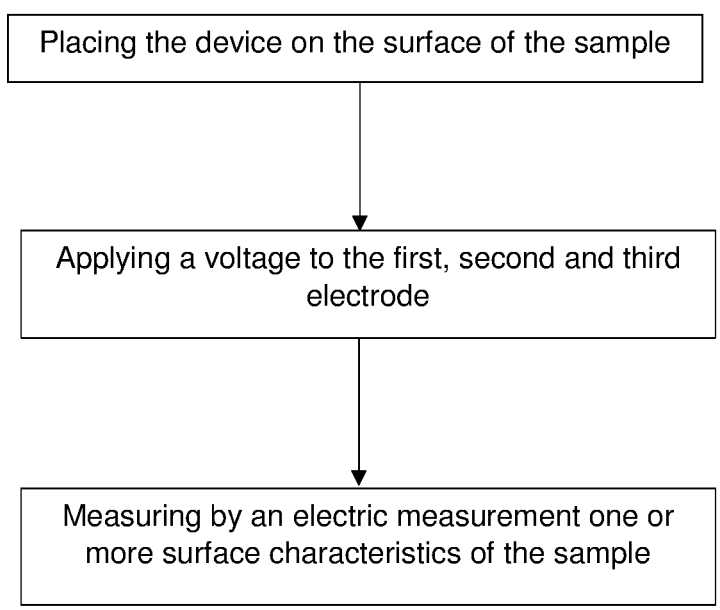
FIG. 10 represents a flow chart of the method for measuring surface characteristics of a sample using a device according to an embodiment.

In general terms, the method for determining surface characteristics of a sample using a device according to an embodiment comprises the following steps, illustrated in the flow chart in FIG. 10:

Placing the device on the sample. The device is placed so that the first 2 and second 3 electrode and the second insulator 6b are in physical contact with the sample surface 8.

Applying an electric voltage to the first 2, second 3 and third 5 electrodes.

Measuring by an electrical measurement, one or more surface characteristics of the sample.

The primary example of this method is the method is the measurement of transistor characteristics of a semiconductor sample. However, the method may be also be applied for the measurement of IV curves for example on any material, including electrically insulating materials.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

As used in the claims below and throughout this disclosure, by the phrase "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A device configured to electrically measure surface characteristics of a sample, the device comprising:
   a first electrode and a second electrode, distanced apart from each other and configured to be in physical contact with a surface of a sample when the device is placed thereon;
   a third electrode, at least a portion of which is located in an area between the first electrode and the second electrode;
   one or more first dielectric portions of one or more dielectric layers disposed between the third electrode and the first and second electrodes, the one or more first dielectric portions configured to electrically isolate the third electrode from the first electrode and the second electrode;
   a second dielectric portion of the one or more dielectric layers configured to electrically isolate the third electrode from the surface of the sample when the device is placed on the surface; and
   one or more holders attached to an assembly comprising the first electrode, the second electrode, the third electrode, and the one or more first dielectric portions, wherein conductors are incorporated in the one or more holders and are adapted to electrically connect the first electrode, the second electrode, and the third electrode individually to a first power source or a first measurement tool, and wherein the first electrode and the second electrode are configured to extend further outward from the one or more holders and towards the surface of the sample than the third electrode to provide electrical contact with the surface of the sample.

2. The device of claim 1, wherein the first electrode and the second electrode are arranged colinearly with each other and the third electrode or the portion of the third electrode, to form a colinear assembly.

3. The device of claim 2, further comprising two additional electrodes placed on either side of the colinear assembly, the two additional electrodes being electrically isolated from the first electrode, the second electrode, and the third electrode, and wherein the one or more holders comprise additional conductors adapted to connect the additional electrodes individually to a second power source or a second measurement tool.

4. The device of claim 3, wherein the first electrode and the second electrode and the two additional electrodes are pillar-shaped electrodes arranged in a linear array, and wherein the third electrode is located in an area in between the first electrode and the second electrode and around the linear array, while being isolated from the linear array by the one or more first dielectric portions, and wherein the second dielectric portion electrically isolates the third electrode from the surface when the device is placed thereon.

5. The device of claim 3, further comprising one or more further electrodes, wherein the one or more further electrodes are placed colinearly with and in addition to the two additional electrodes and are electrically isolated from the two additional electrodes.

6. The device of claim 1, wherein the first electrode, the second electrode, and the third electrode are arranged coaxially to form a coaxial assembly, and wherein the first electrode forms a central electrode, the third electrode forms a sleeve around the first electrode, and the second electrode forms a sleeve around the first electrode and the third electrode, with the one or more first dielectric portions forming a double sleeve that electrically isolates the third electrode from the first electrode and the second electrode and the second dielectric portion electrically isolating the third electrode from the surface when the device is placed thereon.

7. The device of claim 6, further comprising two additional coaxial electrodes placed on either side of the coaxial assembly, in a radial direction of the coaxial assembly, and isolated from the first electrode, the second electrode, and the third electrode and wherein the one or more holders comprise additional conductors adapted to connect the additional electrodes individually to a second power source or second measurement tool.

8. The device of claim 7, further comprising one or more further coaxially placed electrodes, in addition to the two additional electrodes and electrically isolated from the two additional electrodes.

9. The device of claim 1, wherein the one or more holders is a single holder, wherein an assembly of the first electrode, the second electrode, the third electrode, the one or more first dielectric portions, and the second dielectric portion is attached to the single holder.

10. The device of claim 9, wherein the first electrode and the second electrode extend further outward from the single holder than the second dielectric portion, so that the first electrode and the second electrode are adapted to be pushed into the surface in order to realize a physical contact between the second dielectric portion and the surface.

11. The device of claim 1, wherein the one or more holders comprise three separate holders and wherein the first electrode, the second electrode and an assembly of the third electrode, the one or more first dielectric portions, and the second dielectric portion are respectively attached to the three separate holders.

12. The device of claim 1, wherein the one or more holders are cantilever-type holders.

13. The device of claim 1, adapted to determine transistor characteristics of the sample having a semiconducting surface area, wherein the one or more holders are adapted to be manipulated so as to place the first electrode, the second electrode, and the second dielectric portion simultaneously on a conductive surface area of the sample, thereby creating a transistor comprising source, drain and gate electrodes, a gate dielectric and a channel, wherein the first electrode and the second electrode respectively are adapted to act as the source electrode and the drain electrode, the third electrode is adapted to act as the gate electrode, the second dielectric portion is adapted to act as the gate dielectric, and a sample surface area between the first electrode and the second electrode is adapted to act as the channel.

14. The device of claim 1, further comprising:
one or more additional assemblies, each comprising:
respective first, second, and third electrodes;
respective one or more first dielectric portions disposed between the respective third electrode and the respective first and second electrodes; and
a respective second dielectric portion,
wherein the one or more holders are attached to the one or more additional assemblies.

15. A method of measuring surface characteristics of a sample, the method comprising:
placing the device of claim 1 on the surface of the sample so that the first electrode, the second electrode and the second dielectric portion are in physical contact with the surface;
applying an electric voltage to the first electrode, the second electrode, and the third electrode; and
measuring, by an electrical measurement, one or more surface characteristics of the sample.

* * * * *